US012336086B2

United States Patent
Uejima et al.

(10) Patent No.: US 12,336,086 B2
(45) Date of Patent: Jun. 17, 2025

(54) HIGH-FREQUENCY MODULE AND COMMUNICATION DEVICE

(71) Applicant: Murata Manufacturing Co., Ltd., Kyoto (JP)

(72) Inventors: Takanori Uejima, Kyoto (JP); Hiromichi Kitajima, Kyoto (JP); Takahiro Eguchi, Kyoto (JP); Nobuaki Ogawa, Kyoto (JP); Yuki Asano, Kyoto (JP); Shota Hayashi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 137 days.

(21) Appl. No.: 18/171,769

(22) Filed: Feb. 21, 2023

(65) Prior Publication Data

US 2023/0199939 A1    Jun. 22, 2023

Related U.S. Application Data

(63) Continuation of application No. PCT/JP2021/032979, filed on Sep. 8, 2021.

(30) Foreign Application Priority Data

Sep. 29, 2020    (JP) .................................. 2020-163754

(51) Int. Cl.
*H05K 1/02* (2006.01)
(52) U.S. Cl.
CPC ......... *H05K 1/0216* (2013.01); *H05K 1/0243* (2013.01)
(58) Field of Classification Search
CPC ........................... H05K 1/0216; H05K 1/0243
See application file for complete search history.

(56) References Cited

U.S. PATENT DOCUMENTS

2007/0246825 A1    10/2007    Oh et al.
2012/0008288 A1    1/2012    Tsukamoto et al.
(Continued)

FOREIGN PATENT DOCUMENTS

JP    2007-294965 A    11/2007
JP    2012-019091 A    1/2012
(Continued)

OTHER PUBLICATIONS

International Search Report for PCT/JP2021/032979 dated Nov. 30, 2021.

*Primary Examiner* — Hoa C Nguyen
(74) *Attorney, Agent, or Firm* — McDonald Hopkins LLC

(57) ABSTRACT

A high-frequency module includes a module substrate having a main surface, circuit components arranged on the main surface, a resin member covering at least a part of the main surface and the circuit components, a metallic shield layer covering at least an upper surface of the resin member, and a metallic shield plate arranged on the main surface and between the circuit component and the circuit component when the main surface is viewed in a plan view. The metallic shield plate is in contact with the metallic shield layer. An engraved mark portion indicating predetermined information is provided on the upper surface of the resin member. At least a part of the engraved mark portion is provided in a portion in which the resin member and the metallic shield plate overlap each other when the main surface is viewed in a plan view.

16 Claims, 6 Drawing Sheets

(56) References Cited

U.S. PATENT DOCUMENTS

| | | | |
|---|---|---|---|
| 2013/0043946 A1 | 2/2013 | Hadjichristos et al. | |
| 2014/0284775 A1* | 9/2014 | Nomura | H01L 24/85 |
| | | | 257/659 |
| 2018/0204781 A1 | 7/2018 | Otsubo | |
| 2019/0393166 A1* | 12/2019 | Otsubo | H01L 23/552 |
| 2020/0008325 A1* | 1/2020 | Otsubo | H05K 1/0216 |
| 2021/0152202 A1 | 5/2021 | Uejima | |
| 2021/0233865 A1* | 7/2021 | Tarui | H01Q 21/065 |
| 2024/0203901 A1* | 6/2024 | Ohda | H01L 23/3121 |

FOREIGN PATENT DOCUMENTS

| | | |
|---|---|---|
| JP | 2014-522216 A | 8/2014 |
| JP | 2015-015498 A | 1/2015 |
| JP | 2018-195756 A | 12/2018 |
| JP | 2020-035820 A | 3/2020 |
| WO | 2017/047539 A1 | 3/2017 |
| WO | 2019/240097 A1 | 12/2019 |

* cited by examiner

HIGH-FREQUENCY MODULE AND COMMUNICATION DEVICE

CROSS REFERENCE TO RELATED APPLICATION

This is a continuation of International Application No. PCT/JP2021/032979 filed on Sep. 8, 2021 which claims priority from Japanese Patent Application No. 2020-163754 filed on Sep. 29, 2020. The contents of these applications are incorporated herein by reference in their entireties.

BACKGROUND OF THE DISCLOSURE

Field of the Disclosure

The present disclosure relates to a high-frequency module and a communication device.

Description of the Related Art

In a mobile communication device such as a cellular phone, in particular, an arrangement configuration of circuit elements constituting a high-frequency front-end circuit has become complicated along with the development of multi-band.

Patent Document 1 discloses a circuit configuration of a transceiver (transmission/reception circuit) including a plurality of transmitters (transmission paths) and a plurality of receivers (reception paths), and a switchplexer (antenna switch) arranged between the plurality of transmitters and receivers and an antenna. Each of the above plurality of transmitters includes a transmission circuit, a transmission power amplifier (PA), and an output circuit. Each of the above plurality of receivers includes a reception circuit, a reception low noise amplifier (LNA), and an input circuit. The output circuit includes a transmission filter, an impedance matching circuit, a duplexer, and the like. The input circuit includes a reception filter, an impedance matching circuit, a duplexer, and the like. According to the above configuration, simultaneous transmission, simultaneous reception, or simultaneous transmission and reception can be performed by the switching operation of the switchplexer.

Patent Document 1: Japanese Unexamined Patent Application Publication No. 2014-522216

BRIEF SUMMARY OF THE DISCLOSURE

However, when the transceiver (transmission/reception circuit) disclosed in Patent Document 1 is configured by a high-frequency module mounted on a mobile communication device, it is assumed that a plurality of circuit components arranged in the transmission path, the reception path, and the transmission/reception path including the antenna switch is electromagnetically coupled to each other. In this case, a harmonic component of a high-power transmission signal amplified by the transmission power amplifier (PA) is superimposed on the transmission signal, and the quality of the transmission signal may be degraded. In addition, there is a case where the isolation between the transmission and the reception is reduced due to the above electromagnetic field coupling, and the above harmonic or an unnecessary wave such as intermodulation distortion between the transmission signal and another high-frequency signal flows into the reception path to degrade the reception sensitivity.

In addition, in order to easily identify the high-frequency module, an engraved mark indicating information such as a model number is provided on the surface of the high-frequency module. As the miniaturization of the high-frequency module progresses, the engraved mark itself becomes smaller, and it is required to keep its visibility high.

Therefore, a possible benefit of the present disclosure is to provide a high-frequency module and a communication device in which the quality deterioration of a transmission signal or a reception signal is suppressed and the visibility of an engraved mark is high.

A high-frequency module according to an aspect of the present disclosure includes a module substrate having a main surface, a first circuit component and a second circuit component arranged on the main surface, a resin member covering at least a part of the main surface, the first circuit component, and the second circuit component, a metallic layer covering at least an upper surface of the resin member and set to a ground potential, and a metallic plate arranged on the main surface and between the first circuit component and the second circuit component when the main surface is viewed in a plan view and set to the ground potential, in which the metallic plate is in contact with the metallic layer, an engraved mark portion indicating predetermined information is provided on the upper surface of the resin member, and at least a part of the engraved mark portion is provided in a portion in which the resin member and the metallic plate overlap when the main surface is viewed in a plan view.

A communication device according to an aspect of the present disclosure includes an RF signal processing circuit configured to process a high-frequency signal transmitted and received by an antenna, and the high-frequency module according to the above aspect configured to transmit the high-frequency signal between the antenna and the RF signal processing circuit.

According to the present disclosure, it is possible to provide a high-frequency module and a communication device in which the quality deterioration of a transmission signal or a reception signal is suppressed and the visibility of an engraved mark is high.

DETAILED DESCRIPTION OF THE DISCLOSURE

Figure 1:
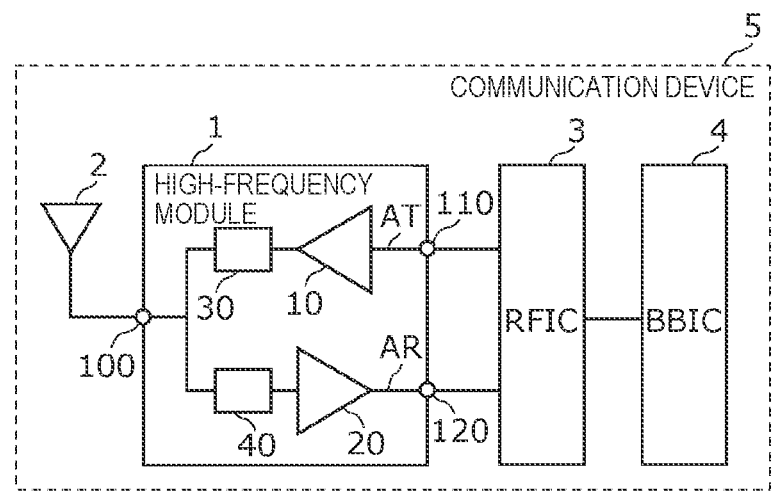
FIG. 1 is a circuit diagram of a high-frequency module and a communication device according to an embodiment.

Hereinafter, a high-frequency module and a communication device according to an embodiment of the present disclosure will be described in detail with reference to the drawings. Note that each of the embodiments described below shows a specific example of the present disclosure. Therefore, numerical values, shapes, materials, constituent elements, the arrangement and connection mode of the constituent elements, and the like shown in the following embodiments are merely examples, and are not intended to limit the present disclosure. Therefore, among the constituent elements in the following embodiments, constituent elements not recited in any of the independent claims are described as optional constituent elements.

In addition, each drawing is a schematic diagram and is not necessarily strictly illustrated. Therefore, for example, scales and the like do not necessarily coincide with each other in the drawings. Additionally, in each of the drawings, substantially the same components are denoted by the same reference numerals, and overlapping description thereof will be omitted or simplified.

In addition, in the present specification, a term indicating a relationship between elements such as parallel, perpendicular or the like, a term indicating a shape of an element such as a rectangle, a straight line or the like, and a numerical range are not expressions representing only a strict meaning, but expressions representing a substantially equivalent range, for example, an expression including a difference of about several %.

In addition, in the present specification, the terms "above" and "below" do not indicate an upward direction (vertically upper) and a downward direction (vertically lower) in absolute spatial recognition, but are used as terms defined by a relative positional relationship based on a laminating order in a laminated configuration. Therefore, for example, the "upper surface" of a component or a member can be not only a surface on the vertically upper side but also various surfaces such as a surface on the vertically lower side, a surface orthogonal to a horizontal direction or the like in an actual use mode.

In addition, in this specification and the drawings, an x-axis, a y-axis, and a z-axis represent three axes of a three-dimensional orthogonal coordinate system. When the module substrate has a rectangular shape in a plan view, the x-axis and the y-axis are directions parallel to a first side of the rectangular shape and a second side orthogonal to the first side, respectively. The z-axis is a thickness direction of the module substrate. Note that in this specification, the "thickness direction" of the module substrate refers to a direction perpendicular to the main surface of the module substrate.

In addition, in this specification, "being connected" includes not only a case of being directly connected by a connection terminal and/or a wiring conductor but also a case of being electrically connected via another circuit element. In addition, "being connected between A and B" means being connected to both A and B between A and B.

In addition, in the component arrangement of the present disclosure, "the module substrate in a plan view" means that an object is viewed by orthographic projection onto an xy plane from a z-axis positive side. In addition, "a component is arranged on a substrate" includes not only a case where the component is arranged on the substrate in contact with the substrate but also a case where the component is arranged above the substrate without contact with the substrate (for example, a case where the component is laminated on another component arranged on the substrate) and a case where a part or all of the component is embedded in the substrate. In addition, "a component is arranged on a main surface of a substrate" includes not only a case where the component is arranged on the main surface in contact with the main surface of the substrate but also a case where the component is arranged above the main surface without contact with the main surface and a case where a part of the component is embedded in the substrate from the main surface side. In addition, "A is arranged between B and C" means that at least one of a plurality of line segments connecting an arbitrary point in B and an arbitrary point in C passes through A.

In addition, unless otherwise specified, ordinal numbers such as "first", "second", and the like in this specification do not denote the number or order of components, but are used for distinguishing components of the same type from each other to avoid confusion.

In addition, in the following description, a "transmission path" means a transmission line constituted by a wiring for transmitting a high-frequency transmission signal, an electrode directly connected to the wiring, a terminal directly connected to the wiring or the electrode, and the like. In addition, a "reception path" means a transmission line constituted by a wiring for transmitting a high-frequency reception signal, an electrode directly connected to the wiring, a terminal directly connected to the wiring or the electrode, and the like. In addition, a "transmission/reception path" means a transmission line constituted by a wiring for transmitting both a high-frequency transmission signal and a high-frequency reception signal, an electrode directly connected to the wiring, a terminal directly connected to the wiring or the electrode, and the like.

Embodiment

[1. Circuit Configuration of High-Frequency Module and Communication Device]

Circuit configurations of a high-frequency module and a communication device according to an embodiment will be described with reference to FIG. 1. FIG. 1 is a circuit configuration diagram of a high-frequency module 1 and a communication device 5 according to an embodiment.

[1-1. Circuit Configuration of Communication Device]

The communication device 5 is a device used in a communication system and is, for example, a mobile terminal such as a smartphone, a tablet computer, or the like. As illustrated in FIG. 1, the communication device 5 includes the high-frequency module 1, an antenna 2, an RF signal processing circuit (RFIC) 3, and a baseband signal processing circuit (BBIC) 4.

The high-frequency module 1 transmits a high-frequency signal between the antenna 2 and the RFIC 3. The internal configuration of the high-frequency module 1 will be described later.

The antenna 2 is connected to an antenna connection terminal 100 of the high-frequency module 1, transmits a high-frequency signal (transmission signal) outputted from the high-frequency module 1, and receives a high-frequency signal (reception signal) from the outside to output the high-frequency signal to the high-frequency module 1.

The RFIC 3 is an example of a signal processing circuit that processes high-frequency signals transmitted and received by the antenna 2. Specifically, the RFIC 3 performs signal processing on the high-frequency reception signal inputted via the reception path of the high-frequency module 1 by down-conversion or the like, and outputs the reception signal generated by the signal processing to the BBIC 4. In addition, the RFIC 3 performs signal processing on the transmission signal inputted from the BBIC 4 by up-conversion or the like, and outputs the high-frequency transmission signal generated by the signal processing to the transmission path of the high-frequency module 1. In addition, the RFIC 3 includes a control unit that controls a switch, an amplifier, and the like included in the high-frequency module 1. Note that some or all of the functions of the control unit of the RFIC 3 may be implemented outside the RFIC 3, for example, in the BBIC 4 or the high-frequency module 1.

The BBIC 4 is a baseband signal processing circuit that performs signal processing using an intermediate-frequency band lower in frequency than the high-frequency signals transmitted by the high-frequency module 1. As the signal processed in the BBIC 4, for example, an image signal for image display and/or an audio signal for communication via a speaker is used.

Note that in the communication device 5 according to the present embodiment, the antenna 2 and the BBIC 4 are not essential components.

[1-2. Circuit Configuration of High-Frequency Module]

Next, a circuit configuration of the high-frequency module 1 will be described.

As illustrated in FIG. 1, the high-frequency module 1 includes a power amplifier 10, a low noise amplifier 20, and functional circuits 30 and 40. In addition, the high-frequency module 1 also includes the antenna connection terminal 100, a transmission input terminal 110, and a reception output terminal 120 as external connection terminals.

The antenna connection terminal 100 is connected to the antenna 2.

The transmission input terminal 110 is a terminal for receiving transmission signals from the outside of the high-frequency module 1 (to be specific, from the RFIC 3).

The reception output terminal 120 is a terminal for supplying reception signals to the outside of the high-frequency module 1 (to be specific, to the RFIC 3).

The high-frequency module 1 is provided with a transmission path AT for transmitting a transmission signal and a reception path AR for transmitting a reception signal. The transmission path AT is a path connecting the transmission input terminal 110 and the antenna connection terminal 100. The reception path AR is a path connecting the reception output terminal 120 and the antenna connection terminal 100. Note that a part of the transmission path AT and a part of the reception path AR are made common. That is, the common portion is a transmission/reception path for transmitting both the transmission signal and the reception signal.

The power amplifier 10 is an example of an amplifier that amplifies a high-frequency signal. The power amplifier 10 is arranged in the transmission path AT and is a transmission amplifier that amplifies transmission signals in one or more communication bands.

The low noise amplifier 20 is an example of an amplifier that amplifies a high-frequency signal. The low noise amplifier 20 is arranged in the reception path AR and is a reception amplifier that amplifies reception signals in one or more communication bands.

Note that the communication band means a frequency band defined in advance by such as a standardization organization (e.g., 3rd Generation Partnership Project (3GPP), Institute of Electrical and Electronics Engineers (IEEE), etc.) for a communication system. The communication band may be a communication band used in a frequency division duplex (FDD) scheme or may be a communication band used in a time division duplex (TDD) scheme.

Here, the communication system means a communication system constructed by using a radio access technology (RAT). As the communication system, for example, a 5th Generation New Radio (5GNR) system, a Long Term Evolution (LTE) system, a Wireless Local Area Network (WLAN) system, and the like can be used, but the communication system is not limited thereto.

The functional circuit 30 is a circuit that is arranged in the transmission path AT and performs a predetermined function. Specifically, the functional circuit 30 includes a transmission filter having a pass band including the communication band of the transmission signal. Alternatively, the functional circuit 30 may include an impedance matching circuit and/or a switch circuit. For example, the functional circuit 30 includes an inductor and/or a capacitor.

In the example illustrated in FIG. 1, the functional circuit 30 is connected between the power amplifier 10 and the antenna connection terminal 100, but is not limited thereto. The functional circuit 30 may be connected between the power amplifier 10 and the transmission input terminal 110. The high-frequency module 1 may include the plurality of functional circuits 30. The plurality of functional circuits 30 may be connected between the power amplifier 10 and the antenna connection terminal 100 and between the power amplifier 10 and the transmission input terminal 110.

The functional circuit 40 is a circuit that is arranged in the reception path AR and performs a predetermined function. Specifically, the functional circuit 40 includes a reception filter having a pass band including the communication band of the reception signal. Alternatively, the functional circuit 40 may include an impedance matching circuit and/or a switch circuit. For example, the functional circuit 40 includes an inductor and/or a capacitor.

In the example illustrated in FIG. 1, the functional circuit 40 is connected between the low noise amplifier 20 and the antenna connection terminal 100, but is not limited thereto. The functional circuit 40 may be connected between the low noise amplifier 20 and the reception output terminal 120. The high-frequency module 1 may include the plurality of functional circuits 40. The plurality of functional circuits 40 may be connected between the low noise amplifier 20 and the antenna connection terminal 100 and between the low noise amplifier 20 and the reception output terminal 120.

In addition, the functional circuit 30 or 40 may be arranged in the transmission/reception path. The functional circuits 30 and 40 may be duplexers or multiplexers including a transmission filter and a reception filter.

The high-frequency module 1 constituted as described above may be capable of transmitting and receiving high-frequency signals in a plurality of communication bands. For example, the high-frequency module 1 may be capable of performing at least one of (1) transmission and reception of a high-frequency signal in a communication band A, (2) transmission and reception of a high-frequency signal in a communication band B, and (3) simultaneous transmission, simultaneous reception, or simultaneous transmission and reception of a high-frequency signal in the communication band A and a high-frequency signal in the communication band B.

In the high-frequency module 1, the transmission path AT and the reception path AR may be separated from each other. For example, each of the transmission path AT and the reception path AR may be connected to the antenna 2 via different terminals. In addition, the high-frequency module 1 may include only one of the transmission path AT and the reception path AR.

[2. Component Arrangement of High-Frequency Module]

Next, an example of a component arrangement of the high-frequency module 1 will be described with reference to FIG. 2 and FIG. 3.

Figure 2:
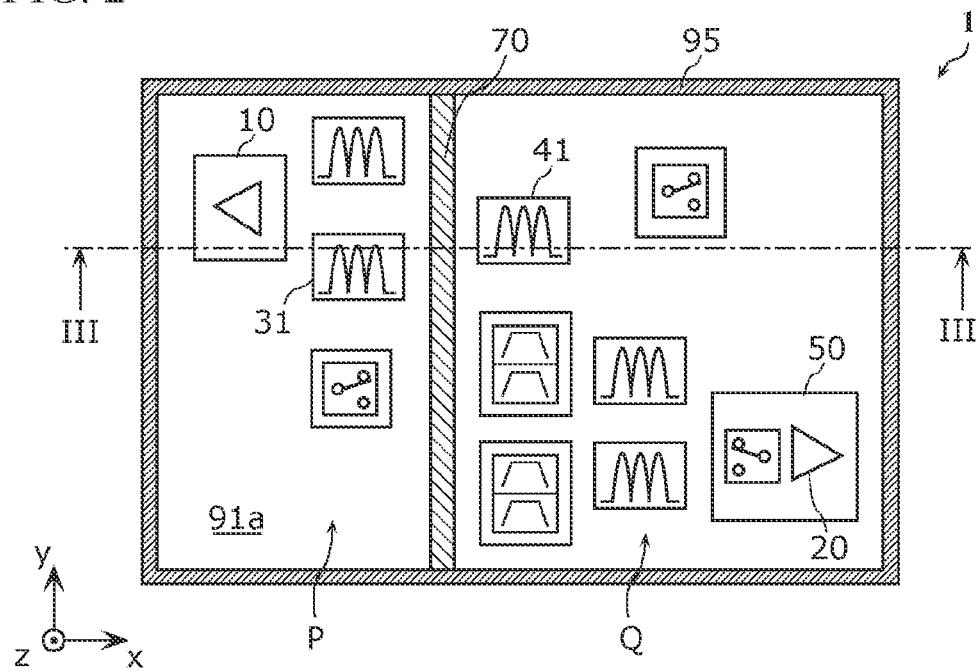
FIG. 2 is a plan view illustrating a component arrangement of the high-frequency module according to the embodiment.

FIG. 2 is a plan view illustrating the component arrangement of the high-frequency module 1 according to the present embodiment. FIG. 3 is a cross-sectional view of the high-frequency module 1 according to the present embodiment. FIG. 3 illustrates a cross section taken along a line III-III in FIG. 2. Note that in FIG. 3, the cross section of a module substrate 91 is not shaded for ease of viewing. In addition, FIG. 3 schematically illustrates a circuit symbol indicating that a metallic shield layer 95 is set to a ground.

Figure 3:
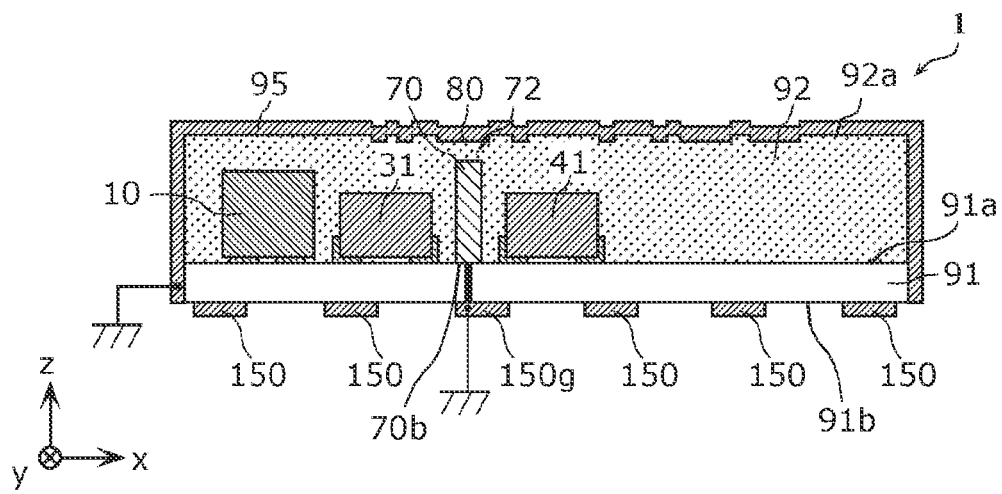
FIG. 3 is a cross-sectional view of the high-frequency module according to the embodiment.

As illustrated in FIG. 2 and FIG. 3, the high-frequency module 1 includes, in addition to the circuit configuration illustrated in FIG. 1, a metallic shield plate 70, an engraved mark portion 80, the module substrate 91, a resin member 92, the metallic shield layer 95, and an external connection terminal 150.

The module substrate 91 has a main surface 91a and a main surface 91b on a side opposite to the main surface 91a. Although the module substrate 91 has a rectangular shape in a plan view, the shape of the module substrate 91 is not limited thereto. As the module substrate 91, for example, a low temperature co-fired ceramics (LTCC) substrate having a laminated structure of a plurality of dielectric layers, a high temperature co-fired ceramics (HTCC) substrate, a component built-in substrate, a substrate having a redistribution layer (RDL), a printed substrate, or the like can be used, but the module substrate 91 is not limited thereto.

The main surface 91a may be referred to as an upper surface or a front surface. As illustrated in FIG. 2, all components (except terminals) constituting the circuit illustrated in FIG. 1 are arranged on the main surface 91a. Specifically, the power amplifier 10, a semiconductor integrated circuit 50 including the low noise amplifier 20, and circuit components 31 and 41 are arranged on the main surface 91a.

The circuit component 31 is an example of a first circuit component arranged in the transmission path AT, and includes circuit elements included in the functional circuit 30 illustrated in FIG. 1. The circuit component 41 is an example of a second circuit component arranged in the reception path AR, and includes circuit elements included in the functional circuit 40 illustrated in FIG. 1. For example, the circuit components 31 and 41 include inductors. Specifically, each of the circuit components 31 and 41 is a chip inductor. The chip inductor is, for example, part of an impedance matching circuit or a filter. In addition, although FIG. 2 schematically illustrates an example in which a duplexer (filter), a switch circuit, and the like are arranged on the main surface 91a, these components do not have to be arranged.

Note that the semiconductor integrated circuit 50 is an electronic component having an electronic circuit formed on the surface and inside of a semiconductor chip (also referred to as a die). In the example illustrated in FIG. 2, the semiconductor integrated circuit 50 includes the low noise amplifier 20 and a switch circuit. The semiconductor integrated circuit 50 is constituted by, for example, a CMOS, and specifically may be constituted by an SOI process. This makes it possible to manufacture the semiconductor integrated circuit 50 at low cost. Note that the semiconductor integrated circuit 50 may be made of at least one of GaAs, SiGe, and GaN. Thus, the semiconductor integrated circuit 50 having high quality can be achieved.

The main surface 91b may be referred to as a lower surface or a rear surface. The plurality of external connection terminals 150 is arranged on the main surface 91b.

The plurality of external connection terminals 150 includes a ground terminal 150g in addition to the antenna connection terminal 100, the transmission input terminal 110, and the reception output terminal 120 illustrated in FIG. 1. Each of the plurality of external connection terminals 150 is connected to a terminal such as an input/output terminal and/or a ground terminal on the motherboard arranged on a z-axis negative side of the high-frequency module 1. The plurality of external connection terminals 150 is, for example, planar electrodes formed on the main surface 91b, but may be bump electrodes. Alternatively, the plurality of external connection terminals 150 may be post electrodes penetrating a resin member covering the main surface 91b.

The resin member 92 is arranged on the main surface 91a of the module substrate 91 and covers the main surface 91a. Specifically, the resin member 92 is provided so as to cover the side surface and the upper surface of each component arranged on the main surface 91a. For example, the resin member 92 covers upper surfaces and side surfaces of the power amplifier 10, the circuit components 31 and 41, the semiconductor integrated circuit 50, and other circuit components. In addition, the resin member 92 covers the side surface of the metallic shield plate 70.

The metallic shield layer 95 covers at least an upper surface 92a of the resin member 92. Specifically, the metallic shield layer 95 is in contact with and covers the upper surface 92a and the side surfaces of the resin member 92. In addition, the metallic shield layer 95 is in contact with and covers an upper end surface 70a of the metallic shield plate 70 (see (b) in FIG. 5 or (b) in FIG. 6). The metallic shield layer 95 is a metal thin film formed by sputtering, for example. The metallic shield layer 95 is set to the ground potential and prevents exogenous noise from entering the circuit components constituting the high-frequency module 1.

The metallic shield plate 70 is a metal wall body vertically arranged from the main surface 91a toward the upper surface 92a of the resin member 92. The metallic shield plate 70 is, for example, a flat plate having a predetermined thickness. The metallic shield plate 70 is in contact with the ground electrode on the main surface 91a and the metallic shield layer 95. That is, since the metallic shield plate 70 is connected to the ground at at least two points of the upper end surface 70a and a lower end surface 70b, the electromagnetic field shielding function (shielding function) is enhanced. Note that the metallic shield plate 70 may be in contact with the metallic shield layer 95 on at least one side end surface of both ends in a y-axis direction illustrated in FIG. 2.

In the present embodiment, a gap is provided between the metallic shield plate 70 and the metallic shield layer 95. To be specific, as illustrated in FIG. 3, the metallic shield plate 70 is provided with a concave portion 72 having a shape cut out from the upper end surface 70a toward the lower end surface 70b of the metallic shield plate 70. The concave portion 72 is filled with a part of the resin member 92. The engraved mark portion 80 is formed on the upper surface of the resin member 92 with which the concave portion 72 is filled. A detailed structure of each of the metallic shield plate 70 and the engraved mark portion 80 will be described later.

The metallic shield plate 70 divides the main surface 91a into a region P and a region Q in a plan view. As illustrated in FIG. 2, the power amplifier 10 and the circuit component 31 are arranged in the region P of the main surface 91a. Circuit components arranged in the transmission path AT are mainly arranged in the region P. In addition, the low noise amplifier 20 and the circuit component 41 are arranged in the region Q of the main surface 91a. Circuit components arranged in the reception path AR are mainly arranged in the region Q.

Note that although not illustrated in FIG. 2, the wirings constituting the transmission path AT and the reception path AR illustrated in FIG. 1 are formed inside the module substrate 91 and on the main surfaces 91a and 91b. In addition, the above-described wirings may be bonding wires whose both ends are bonded to any of the main surfaces 91a and 91b and the circuit components included in the high-frequency module 1, or may be terminals, electrodes, or wirings formed on the surfaces of the circuit components constituting the high-frequency module 1.

The metallic shield plate 70 is arranged between the circuit component 31 and the circuit component 41. Thus, since the circuit component 31 arranged in the transmission path AT and the circuit component 41 arranged in the reception path AR are arranged across the metallic shield plate 70 set to the ground potential, the electromagnetic field coupling between the circuit component 31 and the circuit component 41 can be suppressed. Assuming that when the circuit component 31 arranged in the transmission path AT and the circuit component 41 arranged in the reception path AR are electromagnetically coupled to each other, the high-power transmission signal amplified by the power amplifier 10 and its harmonic components may flow into the reception path AR to degrade the reception sensitivity. By suppressing the electromagnetic field coupling by the metallic shield plate 70, the isolation between the transmission and the reception can be enhanced, and the deterioration of the reception sensitivity can be suppressed.

Note that the circuit components 31 and 41 arranged separately from each other by the metallic shield plate 70 may be components arranged in the transmission path AT and the transmission/reception path, respectively. Assuming that when the circuit component 31 arranged in the transmission path AT and the circuit component 41 arranged in the transmission/reception path are electromagnetically coupled to each other, the harmonic component amplified by the power amplifier 10 may be transmitted from the antenna 2 without being removed by a filter or the like, and the quality of the transmission signal may be degraded. By suppressing the electromagnetic field coupling by the metallic shield plate 70, it is possible to suppress the deterioration of the quality of the transmission signal.

In addition, the circuit components 31 and 41 separated from each other by the metallic shield plate 70 may be components arranged on the reception path AR and the transmission/reception path, respectively. Assuming that when the circuit component 31 arranged in the reception path AR and the circuit component 41 arranged in the transmission/reception path are electromagnetically coupled to each other, the high-power transmission signal amplified by the power amplifier 10 and its harmonic components may flow into the reception path AR to degrade the reception sensitivity. By suppressing the electromagnetic field coupling by the metallic shield plate 70, the isolation between the transmission and the reception can be enhanced, and the deterioration of the reception sensitivity can be suppressed.

In the high-frequency module 1, for example, after each of the circuit components and the metallic shield plate 70 are arranged on the main surface 91a of the module substrate 91, the circuit components, the metallic shield plate 70, and the main surface 91a are entirely molded by using a liquid resin. At this time, the upper end surface 70a of the metallic shield plate 70 may also be covered with the liquid resin. After the liquid resin is cured, the cured resin is polished. At this time, the metallic shield plate 70 may also be polished simultaneously. Thus, the upper end surface 70a of the metallic shield plate 70 and the upper surface 92a of the resin member 92 can be made flush with each other.

Thereafter, the engraved mark portion 80 is formed on the upper surface 92a of the resin member 92, and then a metal film is formed by sputtering so as to cover the upper surface 92a and the side surface of the resin member 92. Thus, the metallic shield layer 95 is formed. Since the upper end surface 70a of the metallic shield plate 70 is exposed from the resin member 92, the metallic shield layer 95 and the upper end surface 70a can be brought into contact with each other. Therefore, the potential of the metallic shield layer 95 can be made equal to the potential of the metallic shield plate 70.

[3. Engraved Mark Portion and Concave Portion of Metallic Shield Plate]

Next, the engraved mark portion 80 and the concave portion 72 of the metallic shield plate 70 included in the high-frequency module 1 will be described with reference to FIG. 4 and FIG. 5.

Figure 4:
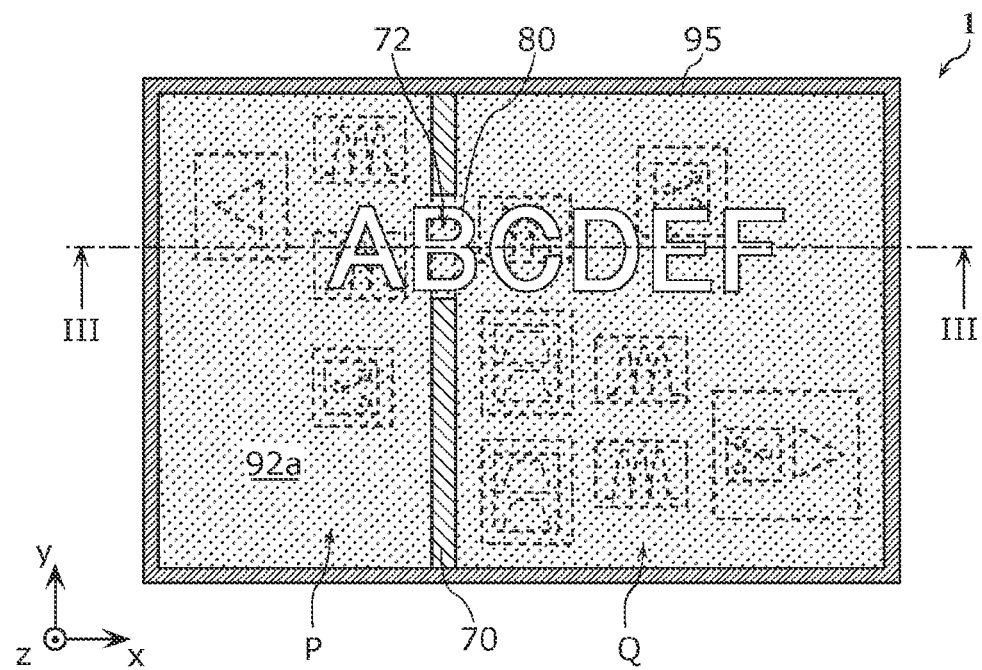
FIG. 4 is a plan view illustrating an engraved mark portion of the high-frequency module according to the embodiment.

FIG. 4 is a plan view illustrating the engraved mark portion of the high-frequency module according to the present embodiment. Specifically, FIG. 4 illustrates the upper surface 92a of the resin member 92 and a cross section of the metallic shield layer 95 at the same position as the upper surface 92a in a z-axis direction. Additionally, in FIG. 4, the circuit components illustrated in FIG. 3 are indicated by the broken lines.

The engraved mark portion 80 indicates predetermined information about the high-frequency module 1. The predetermined information is a model number, a lot number at the time of manufacture, and/or a manufacturer name of the high-frequency module 1. The engraved mark portion 80 includes a character, a figure, or a symbol. The character is an alphabet or a number, but may be a hiragana, katakana, kanji, or the like. In the example illustrated in FIG. 4, the engraved mark portion 80 includes six characters "ABCDEF".

The engraved mark portion 80 is formed by a groove and/or a concave portion provided in the upper surface 92a of the resin member 92. For example, the engraved mark portion 80 is a plurality of grooves formed along a line of a character. The engraved mark portion 80 is formed by, for example, irradiating the upper surface 92a of the resin member 92 with laser light and cutting a part of the resin member 92. Note that the engraved mark portion 80 may be a character (convex portion) raised by cutting off a portion other than the line of the character.

In the present embodiment, the metallic shield layer 95 is provided so as to cover the engraved mark portion 80. The depth of the groove and/or the concave portion forming the engraved mark portion 80 is longer than the thickness of the metallic shield layer 95. The metallic shield layer 95 is formed with a uniform film thickness so as to follow the concave-convex shape of the engraved mark portion 80. Therefore, on the surface (upper surface) of the metallic shield layer 95, the concave and convex parts equivalent to the engraved mark portion 80 are formed. Thus, even when the engraved mark portion 80 is covered with the metallic shield layer 95, the engraved mark portion 80 can be visually recognized from the outside.

At least a part of the engraved mark portion 80 is provided in a portion where the resin member 92 and the metallic shield plate 70 overlap each other when the main surface 91a is viewed in a plan view. That is, the engraved mark portion 80 overlaps the metallic shield plate 70 in a plan view. As illustrated in FIG. 4, the engraved mark portion 80 is provided in both the region P and the region Q so as to straddle the metallic shield plate 70.

Figure 5:
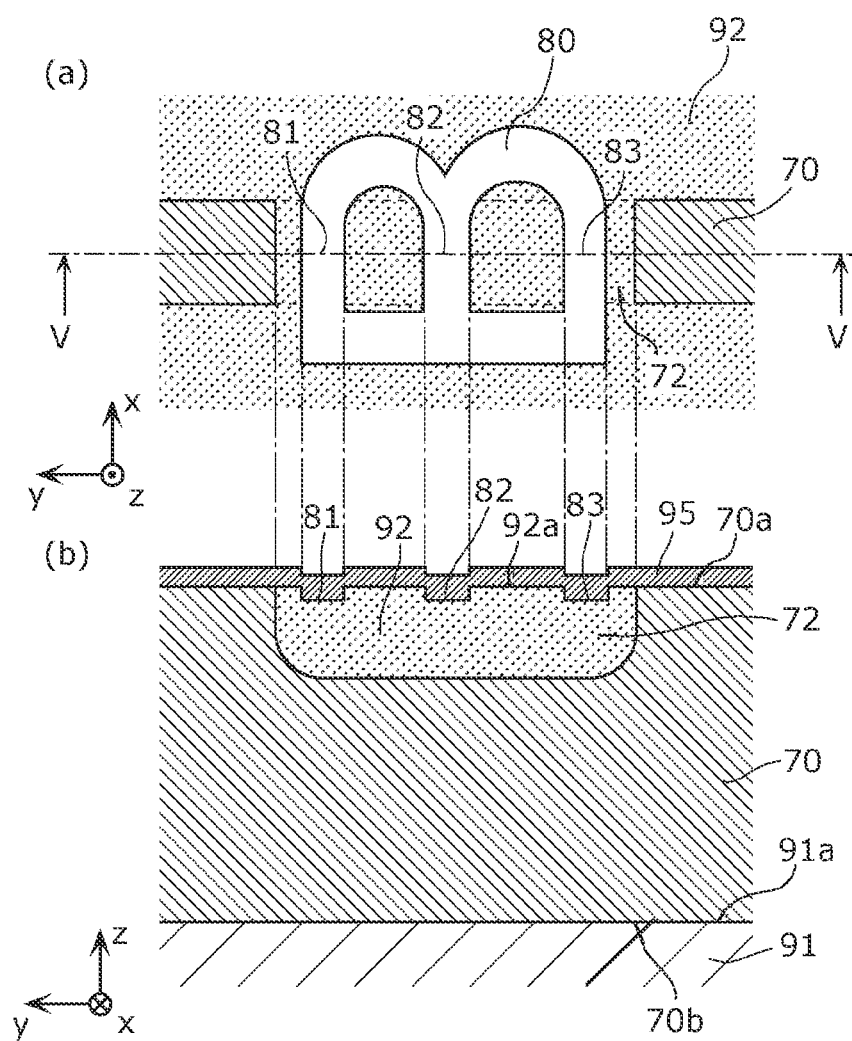
FIG. 5 is a plan view and a cross-sectional view illustrating a first example of a concave portion of a metallic shield plate.

FIG. 5 is a plan view and a cross-sectional view illustrating the concave portion 72 of the metallic shield plate 70. Specifically, (a) in FIG. 5 is an enlarged plan view illustrating the character "B" and its peripheral portion of the engraved mark portion 80 illustrated in FIG. 4. In FIG. 5, (b) illustrates a cross section taken along a line V-V in (a).

As illustrated in FIG. 5, the character "B" which is a part of the engraved mark portion 80 is provided on the upper surface 92a of the resin member 92 with which the concave portion 72 of the metallic shield plate 70 is filled. The character "B" overlaps the metallic shield plate 70 at three locations (specifically, three areas 81 to 83) in a plan view. The three areas 81 to 83 are parts of three horizontal lines of the character "B", respectively. As illustrated in FIG. 5, the concave portion 72 is one concave portion including the three areas 81 to 83 in a plan view. That is, the length of the concave portion 72 in the y-axis direction is longer than the distance from the end (area 81) to the end (area 83) of the character "B" in the y-axis direction.

The concave portion 72 has a shape cut out from the upper end surface 70a toward the lower end surface 70b of the metallic shield plate 70. In (b) of FIG. 5, the cross-sectional shape of the concave portion 72 is a U shape, but is not particularly limited thereto. The bottom surface and the side surface of the concave portion 72 may perpendicularly intersect with each other, and the cross-sectional shape of the concave portion 72 may be a V-shape or a semicircular shape. The depth of the concave portion 72 may be at least deeper than the depth of the engraved mark portion 80.

As described above, the engraved mark portion 80 is provided at a position overlapping the concave portion 72 in a plan view, and is provided on the upper surface 92a of the portion of the resin member 92 with which the concave portion 72 is filled. That is, the engraved mark portion 80 is not directly formed on the upper end surface 70a of the metallic shield plate 70. Assuming that in a case where the engraved mark portion 80 is directly formed on the upper end surface 70a of the metallic shield plate 70, the visibility of the engraved mark portion 80 deteriorates. This is mainly due to the difference in material between the metallic shield plate 70 and the resin member 92. Due to the difference in material, the depth of the groove and/or the concave portion formed by the laser is different between the metallic shield plate 70 and the resin member 92. Specifically, the groove and/or the concave portion formed in the metallic shield plate 70 is shallower than the groove and/or the concave portion formed in the resin member 92. For this reason, the visibility of the groove and/or the concave portion formed in the upper end surface 70a of the metallic shield plate 70 is deteriorated, and thus there may be a case where the character cannot be correctly grasped.

On the other hand, in the high-frequency module 1 according to the present embodiment, the engraved mark portion 80 is not directly provided on the upper end surface 70a of the metallic shield plate 70. In other words, since the entire engraved mark portion 80 is provided in the resin member 92, the variation in the depth of the groove and/or the concave portion is suppressed, and the visibility of the engraved mark portion 80 can be enhanced. In addition, even when the region where the metallic shield plate 70 is not provided (specifically, the regions P and Q) is narrowed as in the case where the size of the high-frequency module 1 is reduced or the case where a plurality of metallic shield plates 70 is provided, the engraved mark portion 80 can be provided at a position overlapping the metallic shield plate 70 in a plan view. In other words, the engraved mark portion 80 can be provided relatively freely.

FIG. 5 illustrates an example in which the metallic shield plate 70 is provided with a relatively large concave portion 72 that extends from one end to the other end of the character "B", but it is not limited thereto. Hereinafter, a modification of the concave portion 72 will be described with reference to FIG. 6 and FIG. 7.

Figure 6:
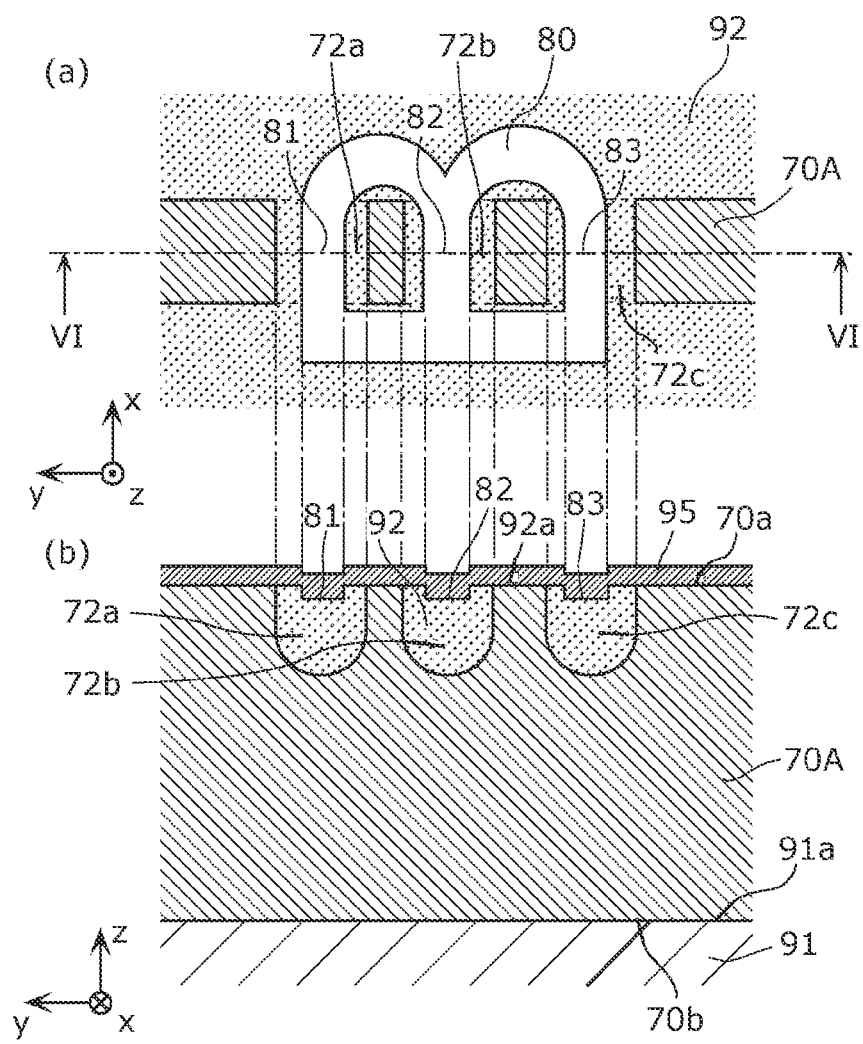
FIG. 6 includes a plan view and a cross-sectional view illustrating a second example of a concave portion of a metallic shield plate.

FIG. 6 is a plan view and a cross-sectional view illustrating concave portions 72a to 72c of a metallic shield plate 70A. Specifically, (a) in FIG. 6 is an enlarged plan view illustrating the character "B" and its peripheral portion of the engraved mark portion 80 illustrated in FIG. 4. In FIG. 6, (b) illustrates a cross section taken along a line VI-VI in (a).

In the metallic shield plate 70A illustrated in FIG. 6, a concave portion is provided at each location where the character "B" which is a part of the engraved mark portion 80 and the metallic shield plate 70A overlap each other. That is, the same number of concave portions as the number of portions overlapping the lines constituting the character "B" and the metallic shield plate 70A is provided. To be specific, since the character "B" overlaps the metallic shield plate 70 at the three areas 81 to 83, the metallic shield plate 70A is provided with the three concave portions 72a to 72c.

This makes it possible to reduce the area of the plurality of concave portions 72a to 72c when the main surface of the metallic shield plate 70 is viewed from the front. That is, since the gap (concave portion) of the metallic shield plate 70 can be reduced, the shield performance can be enhanced while the visibility of the engraved mark portion 80 is ensured.

Figure 7:
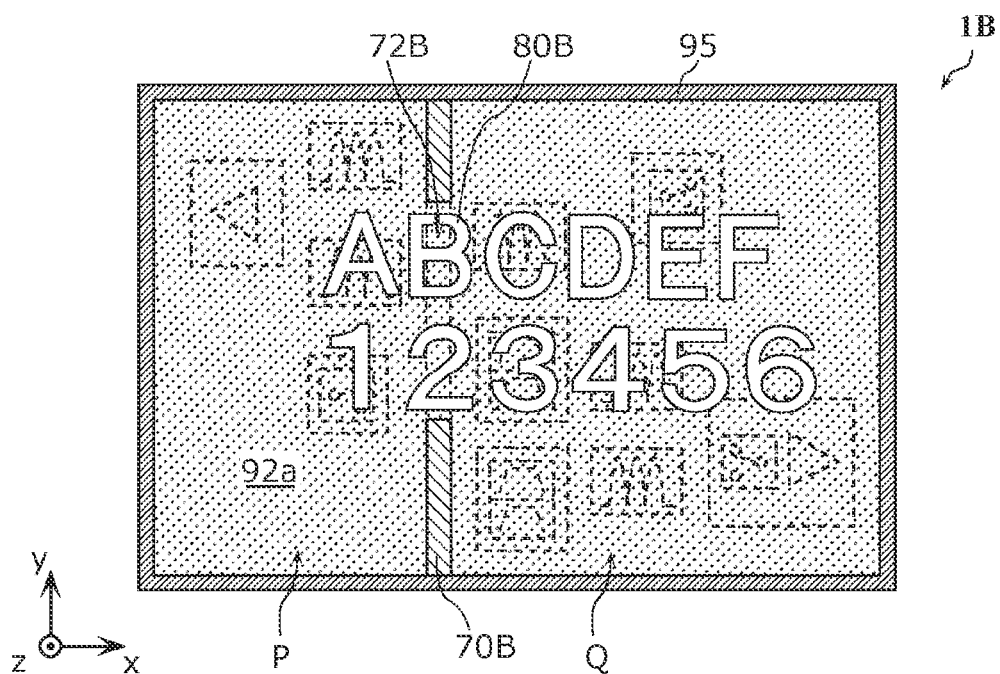
FIG. 7 is a plan view illustrating a third example of a concave portion of a metallic shield plate.

FIG. 7 is a plan view illustrating the concave portion 72B of the metallic shield plate 70B. A high-frequency module 1B illustrated in FIG. 7 includes an engraved mark portion 80B instead of the engraved mark portion 80. In the engraved mark portion 80B, six characters "ABCDEF" and six characters "123456" are provided in two rows. The character "B" and the character "2" overlap the metallic shield plate 70B in a plan view.

The concave portion 72B provided in the metallic shield plate 70B includes all of a plurality of locations overlapping the metallic shield plate 70B among a plurality of lines constituting the two characters "B" and "2". That is, the length of the concave portion 72B in the y-axis direction is longer than the distance from the end of the character "B" on the positive side in the y-axis direction to the end of the character "2" on the negative side in the y-axis direction.

By providing a relatively large concave portion 72B in this way, even when the position of the engraved mark portion 80B is displaced during manufacturing, the engraved mark portion 80B can be accommodated within the concave portion 72B. Therefore, it is possible to manufacture the high-frequency module 1B having high visibility of the engraved mark portion 80B with a high yield.

Figure 8:
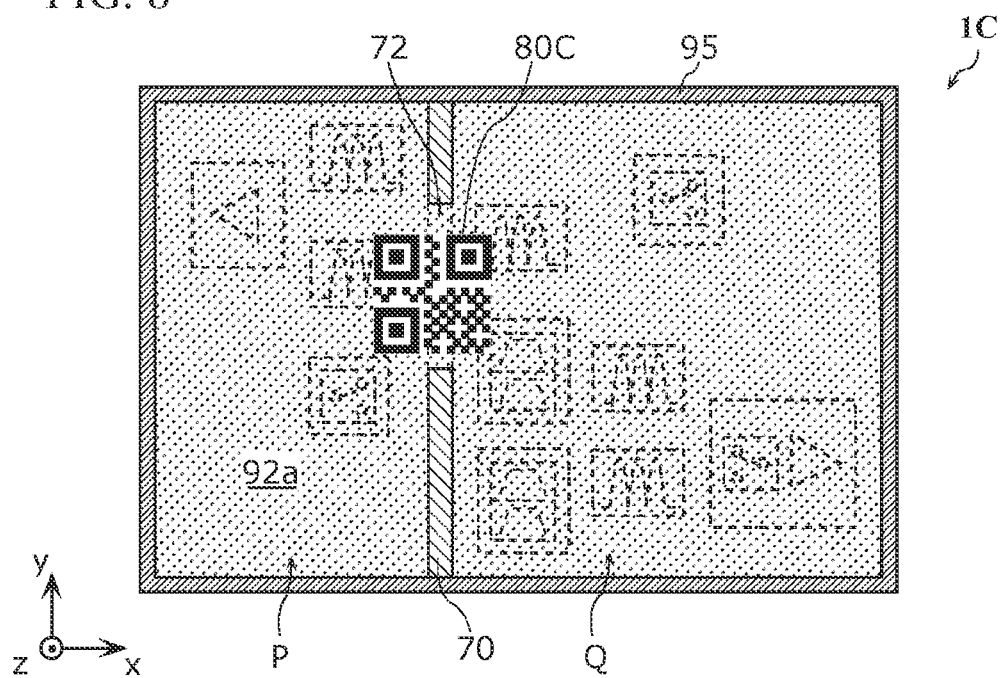
FIG. 8 is a plan view illustrating an engraved mark portion of a high-frequency module according to a modification of the embodiment.

Note that the engraved mark portion may include a two-dimensional code as illustrated in FIG. 8.

FIG. 8 is a plan view illustrating an engraved mark portion 80C of a high-frequency module 1C according to a modification of the embodiment. The engraved mark portion 80C is a QR code (trademark) that is an example of a two-dimensional code. The QR code represents, for example, a uniform resource locator (URL) indicating a web page that presents information related to the high-frequency module 1C, and the like.

The QR code, which is at least a part of the engraved mark portion 80C, is provided in a portion where the resin member 92 and the metallic shield plate 70 overlap each other when the main surface 91a is viewed in a plan view. That is, the QR code may overlap the metallic shield plate 70 in a plan view. As illustrated in FIG. 8, the engraved mark portion 80 is provided in both the region P and the region Q so as to straddle the metallic shield plate 70.

In a two-dimensional code such as the QR code, it is impossible to divide information into two rows like the engraved mark portion 80B. That is, since it is impossible to separately arrange only a part of the two-dimensional code, a situation in which the two-dimensional code inevitably overlaps the metallic shield plate 70 is likely to occur. Even in this case, by providing the concave portion 72, it is possible to provide the QR code with high visibility even in the region overlapping the metallic shield plate 70.

[4. Structure of Metallic Shield Plate]

Next, a structure of the metallic shield plate 70 included in the high-frequency module 1 according to the present embodiment will be described with reference to FIG. 9A to FIG. 9D.

Figure 9A:
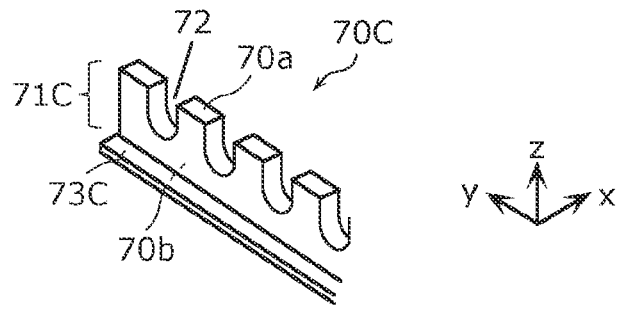
FIG. 9A is an external perspective view illustrating a first example of a metallic shield plate.

FIG. 9A is an external perspective view of a metallic shield plate 70C. The metallic shield plate 70C is an example of the metallic shield plate 70, 70A, or 70B according to the embodiment. The metallic shield plate 70C is vertically arranged at a right angle from the main surface 91a (not illustrated) toward the upper surface 92a of the resin member 92 (not illustrated).

The metallic shield plate 70C has a main body portion 71C vertically arranged at a right angle from the main surface 91a toward the upper surface 92a of the resin member 92, and an extension portion 73C arranged to extend in parallel to the main surface 91a from a lower end portion of the main body portion 71C. The extension portion 73C is bonded to the ground electrode (not illustrated) on the main surface 91a.

The concave portion 72 is provided in the main body portion 71C. In FIG. 9A, the plurality of concave portions 72 is provided. The engraved mark portion 80 may overlap only one among the plurality of concave portions 72 in a plan view. That is, the concave portion 72 may also be provided at a position where the engraved mark portion 80 is not provided in a plan view.

According to the structure of the metallic shield plate 70C, since the concave portion 72 is provided between the main body portion 71C and the metallic shield layer 95, in the step of forming the resin member 92 on the main surface 91a, good fluidity of the liquid resin in the vicinity of the upper end portion of the metallic shield plate 70C can be ensured. Therefore, since the resin can be spread to every corner in the vicinity of the upper end portion of the metallic shield plate 70C, it is possible to suppress the occurrence of a gap or the like in which the resin member 92 is not formed.

Figure 9B:
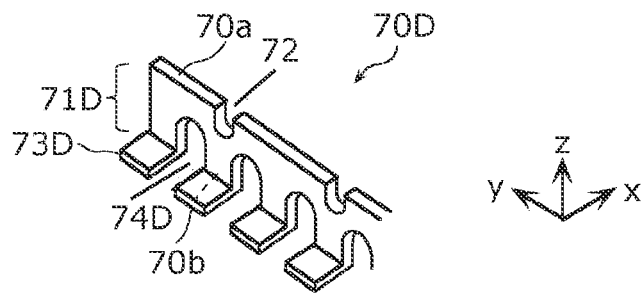
FIG. 9B is an external perspective view illustrating a second example of a metallic shield plate.

FIG. 9B is an external perspective view of the metallic shield plate 70D. The metallic shield plate 70D is an example of the metallic shield plate 70, 70A, or 70B according to the embodiment. The metallic shield plate 70D is vertically arranged at a right angle from the main surface 91a (not illustrated) toward the upper surface 92a of the resin member 92 (not illustrated). The metallic shield plate 70D is provided with a through-hole 74D penetrating in a direction parallel to the main surface 91a.

The through-hole 74D has a shape cut out from the lower end surface 70b of the metallic shield plate 70D toward the upper end surface 70a. The metallic shield plate 70D is provided with the plurality of through-holes 74D. The plurality of through-holes 74D is arranged at equal intervals along the y-axis direction, but the intervals may be random. The shapes and sizes of the plurality of through-holes 74D may be the same as or different from each other. In addition, the metallic shield plate 70D may be provided with only one through-hole 74D.

In addition, the metallic shield plate 70D has a main body portion 71D vertically arranged at a right angle from the main surface 91a toward the upper surface 92a of the resin member 92, and an extension portion 73D arranged to extend in parallel to the main surface 91a from a lower end portion of the main body portion 71D. The extension portion 73D is bonded to the ground electrode (not illustrated) on the main surface 91a. The extension portion 73D is divided into a plurality of portions discretely arranged along the y-axis direction. Note that the extension portion 73D may be one elongated flat plate portion continuous along the y-axis direction, like the extension portion 73C illustrated in FIG. 9A.

The concave portion 72 is provided in the main body portion 71D. In FIG. 9B, the plurality of concave portions 72 is provided. The engraved mark portion 80 may overlap only one of the plurality of concave portions 72 in a plan view.

According to the structure of the metallic shield plate 70D, since the through-hole 74D is provided between the main body portion 71D and the main surface 91a, in the step of forming the resin member 92 on the main surface 91a, good fluidity of the liquid resin in the vicinity of the lower end portion of the metallic shield plate 70D can be ensured. In addition, since the concave portion 72 is provided between the main body portion 71D and the metallic shield layer 95, good fluidity of the liquid resin in the vicinity of the upper end portion of the metallic shield plate 70D can be ensured. Therefore, since the resin can be spread to every corner in the vicinity of each of the upper end portion and the lower end portion of the metallic shield plate 70D, it is possible to suppress the occurrence of a gap or the like in which the resin member 92 is not formed.

Figure 9C:
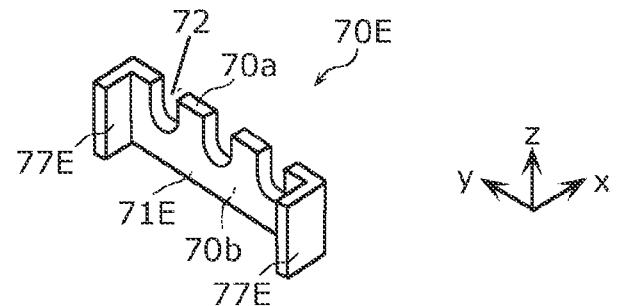
FIG. 9C is an external perspective view illustrating a third example of a metallic shield plate.

FIG. 9C is an external perspective view of a metallic shield plate 70E. The metallic shield plate 70E illustrated in FIG. 9C is an example of the metallic shield plate 70, 70A, or 70B according to the embodiment. The metallic shield plate 70E is vertically arranged from the main surface 91a (not illustrated) toward the upper surface 92a of the resin member 92 (not illustrated) (in the z-axis direction).

In addition, the metallic shield plate 70E has a flat-plate-shaped main body portion 71E vertically arranged from the main surface 91a toward the upper surface 92a of the resin member 92 (in the z-axis direction) and bonded to the ground electrode (not illustrated) on the main surface 91a, and a flat-plate-shaped main body end portion 77E arranged at an end portion of the main body portion 71E located in a direction parallel to the main surface 91a and vertically arranged from the main surface 91a toward the upper surface 92a of the resin member 92 (in the z-axis direction). Here, the main body portion 71E and the main body end portion 77E are not parallel to each other.

The main body portion 71E is provided with the concave portion 72 having a shape cut out from the upper end surface 70*a* toward the lower end surface 70*b*. In FIG. 9C, the plurality of concave portions 72 is provided. The engraved mark portion 80 may overlap only one among the plurality of concave portions 72 in a plan view. That is, the concave portion 72 may also be provided at a position where the engraved mark portion 80 is not provided in a plan view.

According to the structure of the metallic shield plate 70E, since the concave portion 72 is formed in the main body portion 71E, in the step of forming the resin member 92 on the main surface 91*a*, good fluidity of the liquid resin in the vicinity of the metallic shield plate 70E can be ensured. Therefore, it is possible to suppress occurrence of a gap or the like in which the resin member 92 is not formed in the vicinity of the metallic shield plate 70E. Further, since the through-hole is not formed in the region in contact with the main surface 91*a* (a lower region of the main body portion 71E), the isolation between the circuit components arranged on the main surface 91*a*, with the metallic shield plate 70E interposed therebetween, is improved. In addition, since the main body portion 71E and the main body end portion 77E are not parallel to each other, the self-standing property of the metallic shield plate 70E on the main surface 91*a* can be ensured. In addition, since the extension portion 73C or 73D of the metallic shield plate 70C or 70D is not provided, the arrangement space of the metallic shield plate 70E can be reduced.

Figure 9D:
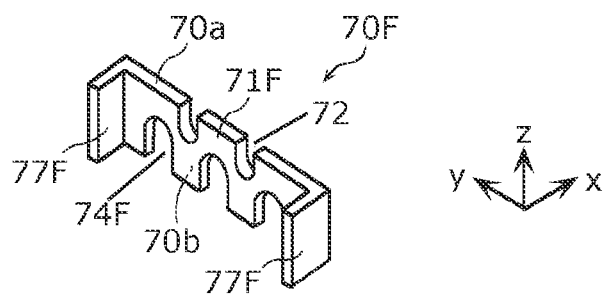
FIG. 9D is an external perspective view illustrating a fourth example of a metallic shield plate.

FIG. 9D is an external perspective view of a metallic shield plate 70F. The metallic shield plate 70F illustrated in FIG. 9D is an example of the metallic shield plate 70, 70A, or 70B according to the embodiment. The metallic shield plate 70F is vertically arranged from the main surface 91*a* (not illustrated) toward the upper surface 92*a* of the resin member 92 (not illustrated) (in the z-axis direction). Between the metallic shield plate 70F and the main surface 91*a*, there is formed a through-hole 74F penetrating in a normal direction (x-axis direction) of the metallic shield plate 70F.

In addition, the metallic shield plate 70F has a flat-plate-shaped main body portion 71F vertically arranged from the main surface 91*a* toward the upper surface 92*a* of the resin member 92 (in the z-axis direction) and bonded to the ground electrode (not illustrated) on the main surface 91*a*, and a flat-plate-shaped main body end portion 77F arranged at an end portion of the main body portion 71F located in a direction parallel to the main surface 91*a* and vertically arranged from the main surface 91*a* toward the upper surface 92*a* of the resin member 92 (in the z-axis direction). Here, the main body portion 71F and the main body end portion 77F are not parallel to each other.

The main body portion 71F is provided with the concave portion 72 having a shape cut out from the upper end surface 70*a* toward the lower end surface 70*b*. In FIG. 9D, the plurality of concave portions 72 is provided. The engraved mark portion 80 may overlap only one of the plurality of concave portions 72 in a plan view. That is, the concave portion 72 may also be provided at a position where the engraved mark portion 80 is not provided in a plan view.

According to the structure of the metallic shield plate 70F, since the through-hole 74F and the concave portion 72 are formed in the main body portion 71F, in the step of forming the resin member 92 on the main surface 91*a*, good fluidity of the liquid resin in the vicinity of the metallic shield plate 70F can be ensured. Therefore, it is possible to suppress the occurrence of a gap or the like in which the resin member 92 is not formed in the vicinity of the metallic shield plate 70F. In addition, since the main body portion 71F and the main body end portion 77F are not parallel to each other, the self-standing property of the metallic shield plate 70F on the main surface 91*a* can be ensured. In addition, since the extension portion 73C or 73D of the metallic shield plate 70C or 70D is not provided, the arrangement space of the metallic shield plate 70F can be reduced.

Note that the structural example of the metallic shield plate 70 is not limited to the above-described metallic shield plates 70C and 70D. For example, the through-hole may pass through the center of the main body portion and needs to reach neither the upper end surface 70*a* nor the lower end surface 70*b*. In addition, a plurality of such through-holes may be arranged side by side from the upper end surface 70*a* to the lower end surface 70*b*. Further, the direction in which the extension portion is arranged to extend is not limited to an x-axis negative direction as illustrated in FIG. 9A and FIG. 9B, and may be an x-axis positive direction. The metallic shield plate 70 may have extension portions arranged to extend on both sides in the x-axis negative direction and the x-axis positive direction. In addition, the direction in which the main body end portion 77E or 77F is arranged to extend is not limited to the x-axis negative direction as illustrated in FIG. 9C or FIG. 9D and may be the x-axis positive direction, furthermore, the metallic shield plate 70 may have both the main body end portion arranged to extend in the x-axis negative direction and the main body end portion arranged to extend in the x-axis positive direction.

[5. Effects and the Like]

As described above, the high-frequency module 1 according to the present embodiment includes the module substrate 91 having the main surface 91*a*, the circuit components 31 and 41 arranged on the main surface 91*a*, the resin member 92 covering at least a part of the main surface 91*a* and the circuit components 31 and 41, the metallic shield layer 95 covering at least the upper surface 92*a* of the resin member 92, and the metallic shield plate 70 arranged on the main surface 91*a* and between the circuit component 31 and the circuit component 41 when the main surface 91*a* is viewed in a plan view. The metallic shield plate 70 is in contact with the metallic shield layer 95. The engraved mark portion 80 indicating predetermined information is provided on the upper surface 92*a* of the resin member 92. At least a part of the engraved mark portion 80 is provided in a portion where the resin member 92 and the metallic shield plate 70 overlap each other when the main surface 91*a* is viewed in a plan view.

Thus, the electromagnetic field coupling between the circuit component 31 and the circuit component 41 can be suppressed by the metallic shield plate 70. Therefore, wrap-around of the transmission signal and its harmonic component due to the electromagnetic field coupling is suppressed, and the deterioration of the quality of the transmission signal or the reception signal can be suppressed.

In addition, assuming that when the engraved mark portion 80 is directly formed on the upper end surface 70*a* of the metallic shield plate 70, the depth of the groove and/or the concave portion becomes shallow at the portion formed on the upper end surface 70*a*, and thus the visibility of the engraved mark portion 80 is deteriorated. On the other hand, in the high-frequency module 1, since the engraved mark portion 80 is not directly formed in the metallic shield plate 70, the visibility of the engraved mark portion 80 can be enhanced.

As described above, it is possible to achieve the high-frequency module 1 in which the deterioration of the quality of the transmission signal or the reception signal is suppressed and the visibility of the engraved mark is high.

Further, for example, the metallic shield plate 70 is provided with at least one concave portion 72 having a shape cut out from the upper end toward the lower end. At least one concave portion 72 is filled with a part of the resin member 92. At least a part of the engraved mark portion 80 is provided on the upper surface 92*a* of the resin member 92 with which the at least one concave portion 72 is filled.

As the size of the high-frequency module 1 becomes smaller, the region in which the engraved mark portion 80 can be provided also becomes smaller. In the high-frequency module 1 according to the present embodiment, since the engraved mark portion 80 can be provided so as to straddle the metallic shield plate 70, it is possible to mark necessary information on the high-frequency module 1 while ensuring visibility.

In addition, since the liquid resin can be caused to flow through the concave portion 72, the resin can be spread to every corner in the vicinity of the upper end portion of the metallic shield plate 70. Therefore, it is possible to suppress the occurrence of a gap or the like in which the resin member 92 is not formed.

In addition, the engraved mark portion 80 overlaps the metallic shield plate 70 at a plurality of locations when the main surface 91*a* is viewed in a plan view. The metallic shield plate 70 is provided with one concave portion 72 including a plurality of locations when the main surface 91*a* is viewed in a plan view.

As a result, by providing the relatively large concave portion 72, the engraved mark portion 80 can be accommodated in the concave portion 72 even in a case where the positional deviation or the like of the engraved mark portion 80 occurs at the time of manufacturing. Therefore, it is possible to manufacture the high-frequency module 1 with high visibility of the engraved mark portion 80 at a high yield.

Further, for example, as illustrated in FIG. 6, the metallic shield plate 70A is provided with a plurality of concave portions 72*a* to 72*c* including a plurality of locations in a one-to-one correspondence manner when the main surface 91*a* is viewed in a plan view.

As a result, when the main surface of the metallic shield plate 70A is viewed from the front, the areas of the concave portions 72*a* to 72*c* can be reduced, so that the shielding function of the metallic shield plate 70A can be enhanced.

For example, the engraved mark portion 80 includes a character, a figure, a symbol, or a two-dimensional code.

Thus, it is possible to easily inform a person of predetermined information by characters or the like. Further, by using the two-dimensional code, it is possible to inform a person of more information.

In addition, for example, the circuit component 31 is arranged in any of the transmission path AT for transmitting a transmission signal, the reception path AR for transmitting a reception signal, and the transmission/reception path for transmitting a transmission signal and a reception signal, and the circuit component 41 is arranged in the path of the transmission path AT, the reception path AR, and the transmission/reception path except for the path in which the circuit component 31 is arranged.

Thus, the electromagnetic field coupling between the circuit component 31 and the circuit component 41 can be suppressed by the metallic shield plate 70. Therefore, wraparound of the transmission signal and its harmonic component due to the electromagnetic field coupling is suppressed, and the deterioration of the quality of the transmission signal or the reception signal can be suppressed. For example, in the case where the circuit component 31 is arranged in the transmission path AT and the circuit component 41 is arranged in the reception path AR, the isolation between the transmission and the reception can be enhanced.

Further, for example, the upper end surface 70*a* of the metallic shield plate 70 is flush with the upper surface 92*a* of the resin member 92.

As a result, the metallic shield layer 95 can smoothly cover the upper end surface 70*a* of the metallic shield plate 70 and the upper surface 92*a* of the resin member 92 without bumps. It is possible to form the metallic shield layer 95 with reduced irregularities and a high shielding effect with a uniform film thickness.

Further, for example, as illustrated in FIG. 9B or FIG. 9D, the metallic shield plate 70 is provided with the through-hole 74D or 74F penetrating in a direction parallel to the main surface 91*a*.

Accordingly, since the liquid resin can be caused to flow through the through-hole 74D or 74F, the resin can be spread to every corner in the vicinity of the metallic shield plate 70, and thus it is possible to suppress the occurrence of a gap or the like in which the resin member 92 is not formed.

In addition, for example, the through-hole 74D or 74F has a shape cut out from the lower end of the metallic shield plate 70 toward the upper end.

As a result, the resin can be spread to every corner in the vicinity of the lower end portion of the metallic shield plate 70, so that it is possible to suppress the occurrence of a gap or the like in which the resin member 92 is not formed.

In addition, for example, the metallic shield plate 70 may have the main body portion 71C or 71D vertically arranged on the main surface 91*a*, and the extension portion 73C or 73D arranged to extend in parallel to the main surface 91*a* from a lower end portion of the main body portion 71C or 71D. The extension portion 73C or 73D is bonded to the ground electrode provided on the main surface 91*a*.

Thus, the connection between the metallic shield plate 70 and the main surface 91*a* of the module substrate 91 can be stabilized. For example, at the time of molding using a liquid resin, the metallic shield plate 70 can be made less likely to fall down. Further, since the contact area with the ground electrode provided on the main surface 91*a* can be increased, the ground to the metallic shield plate 70 can be strengthened. Therefore, the shielding function of the metallic shield plate 70 can be enhanced.

In addition, the metallic shield plate 70 may have the main body portion 71E or 71F bonded to the ground electrode provided on the main surface 91*a* and vertically arranged on the main surface 91*a*, and the flat-plate-shaped main body end portion 77E or 77F arranged at an end portion of the main body portion 71E or 71F located in a direction parallel to the main surface 91*a*, and vertically arranged from the main surface 91*a* toward the upper surface 92*a* of the resin member 92. The main body portion 71E or 71F and the main body end portion 77E or 77F may be non-parallel to each other.

According to this configuration, since the main body portion 71E or 71F and the main body end portion 77E or 77F are not parallel to each other, the self-standing property of the metallic shield plate 70 on the main surface 91*a* can be ensured. In addition, since the extension portion 73C or 73D is not provided, it is possible to reduce the arrangement space of the metallic shield plate 70.

In addition, the communication device 5 according to the present embodiment includes the RFIC 3 that processes a high-frequency signal transmitted and received by the antenna 2, and the high-frequency module 1 that transmits a high-frequency signal between the antenna 2 and the RFIC 3.

Accordingly, in the communication device 5, it is possible to obtain an effect equivalent to that of the high-frequency module 1.

(Others)

Although the high-frequency module and the communication device according to the present disclosure have been described based on the above-described embodiments, the present disclosure is not limited to the above-described embodiments.

For example, in the high-frequency module according to the embodiment, each of the circuit components constituting the high-frequency module is arranged on one main surface 91a of the module substrate 91, but each of the circuit components may be distributed and arranged on the main surfaces 91a and 91b of the module substrate 91 facing each other. That is, each of the circuit components constituting the high-frequency module 1 may be mounted on one surface of the module substrate or may be mounted on both surfaces of the module substrate.

In addition, the upper end surface 70a of the metallic shield plate 70 and the metallic shield layer 95 need not be in contact with each other. For example, the metallic shield plate 70 may be in contact with the metallic shield layer 95 at the side end surface thereof and need not be in contact with the metallic shield layer 95 at the upper end surface 70a. In this case, the engraved mark portion 80 with high visibility can be provided at an arbitrary position overlapping the metallic shield plate 70 in a plan view.

In addition, the concave portion 72 need not penetrate through the metallic shield plate 70 in the thickness direction. For example, when the thickness of the metallic shield plate 70 is thicker than the width of the engraved mark portion 80, the entire engraved mark portion 80 may enter the inside of the upper end surface 70a of the metallic shield plate 70 in a plan view. In this case, the width of the concave portion 72 (the length in the x-axis direction, that is, in the thickness direction of the metallic shield plate 70) may be smaller than the thickness of the metallic shield plate 70. As a result, when the main surface of the metallic shield plate 70 is viewed from the front, the concave portion 72 is not visible, so that the shield performance can be enhanced.

In addition, for example, in the high-frequency module and the communication device according to the embodiment, another circuit element, wiring, or the like may be inserted between the paths connecting each of the circuit elements and the signal paths disclosed in the drawings.

In addition, an embodiment obtained by applying various modifications conceived by a person skilled in the art to each embodiment and an embodiment realized by arbitrarily combining constituent elements and functions in each embodiment within a region not departing from the gist of the present disclosure are also included in the present disclosure.

The present disclosure can be widely used in communication devices such as mobile phones as a high-frequency module arranged in a front-end portion compatible with multi-band.

1, 1B, 1C HIGH-FREQUENCY MODULE
2 ANTENNA
3 RFIC
4 BBIC
5 COMMUNICATION DEVICE
10 POWER AMPLIFIER
20 LOW NOISE AMPLIFIER
30, 40 FUNCTIONAL CIRCUIT
31, 41 CIRCUIT COMPONENT
50 SEMICONDUCTOR INTEGRATED CIRCUIT
70, 70A, 70B, 70C, 70D, 70E, 70F METALLIC SHIELD PLATE
70a UPPER END SURFACE
70b LOWER END SURFACE
71C, 71D, 71E, 71F MAIN BODY PORTION
72, 72a, 72b, 72c, 72B CONCAVE PORTION
73C, 73D EXTENSION PORTION
74D, 74F THROUGH-HOLE
77E, 77F MAIN BODY END PORTION
80, 80B, 80C ENGRAVED MARK PORTION
81, 82, 83 AREA
91 MODULE SUBSTRATE
91a, 91b MAIN SURFACE
92 RESIN MEMBER
92a UPPER SURFACE
95 METALLIC SHIELD LAYER
100 ANTENNA CONNECTION TERMINAL
110 TRANSMISSION INPUT TERMINAL
120 RECEPTION OUTPUT TERMINAL
150 EXTERNAL CONNECTION TERMINAL
150g GROUND TERMINAL
P, Q REGION

The invention claimed is:

1. A high-frequency module comprising:
a module substrate having a main surface;
a first circuit component and a second circuit component arranged on the main surface;
a resin member covering at least a part of the main surface, the first circuit component, and the second circuit component;
a metallic layer covering at least an upper surface of the resin member and set to a ground potential; and
a metallic plate arranged on the main surface and between the first circuit component and the second circuit component when the main surface is viewed in a plan view and set to the ground potential,
wherein the metallic plate is in contact with the metallic layer,
an engraved mark portion indicating predetermined information is provided on the upper surface of the resin member,
at least a part of the engraved mark portion is provided in a portion in which the resin member and the metallic plate overlap each other when the main surface is viewed in a plan view,
the metallic plate is provided with at least one concave portion having a shape cut out from an upper end of the metallic plate toward a lower end of the metallic plate,
the at least one concave portion is filled with a part of the resin member, and
at least a part of the engraved mark portion is provided on an upper surface of the resin member with which the at least one concave portion is filled.

2. The high-frequency module according to claim 1,
wherein the engraved mark portion overlaps the metallic plate at a plurality of locations when the main surface is viewed in a plan view, and
the at least one concave portion includes one concave portion including the plurality of locations when the main surface is viewed in a plan view.

3. The high-frequency module according to claim 2,
wherein the engraved mark portion includes a character, a figure, a symbol, or a two-dimensional code.

4. The high-frequency module according to claim 2,
wherein the first circuit component is arranged in any of
a transmission path for transmitting a transmission signal, a reception path for transmitting a reception signal, and a transmission/reception path for transmitting a transmission signal and a reception signal, and
the second circuit component is arranged in any of the transmission path, the reception path, and the transmission/reception path except for a path in which the first circuit component is arranged.

5. The high-frequency module according to claim 1,
wherein the engraved mark portion overlaps the metallic plate at a plurality of locations when the main surface is viewed in a plan view, and
the at least one concave portion includes a plurality of concave portions including the plurality of locations in a one-to-one correspondence manner when the main surface is viewed in a plan view.

6. The high-frequency module according to claim 5,
wherein the engraved mark portion includes a character, a figure, a symbol, or a two-dimensional code.

7. The high-frequency module according to claim 5,
wherein the first circuit component is arranged in any of
a transmission path for transmitting a transmission signal, a reception path for transmitting a reception signal, and a transmission/reception path for transmitting a transmission signal and a reception signal, and
the second circuit component is arranged in any of the transmission path, the reception path, and the transmission/reception path except for a path in which the first circuit component is arranged.

8. The high-frequency module according to claim 1,
wherein the engraved mark portion includes a character, a figure, a symbol, or a two-dimensional code.

9. The high-frequency module according to claim 8,
wherein the first circuit component is arranged in any of
a transmission path for transmitting a transmission signal, a reception path for transmitting a reception signal, and a transmission/reception path for transmitting a transmission signal and a reception signal, and
the second circuit component is arranged in any of the transmission path, the reception path, and the transmission/reception path except for a path in which the first circuit component is arranged.

10. The high-frequency module according to claim 1,
wherein the first circuit component is arranged in any of
a transmission path for transmitting a transmission signal, a reception path for transmitting a reception signal, and a transmission/reception path for transmitting a transmission signal and a reception signal, and
the second circuit component is arranged in any of the transmission path, the reception path, and the transmission/reception path except for a path in which the first circuit component is arranged.

11. The high-frequency module according to claim 1,
wherein an upper end surface of the metallic plate is flush with the upper surface of the resin member.

12. The high-frequency module according to claim 1,
wherein the metallic plate is provided with a through-hole penetrating in a direction parallel to the main surface.

13. The high-frequency module according to claim 12,
wherein the through-hole has a shape cut out from a lower end toward an upper end of the metallic plate.

14. The high-frequency module according to claim 1,
wherein the metallic plate includes:
a main body portion vertically arranged on the main surface; and
an extension portion arranged to extend in parallel to the main surface from a lower end portion of the main body portion, and
wherein the extension portion is bonded to a ground electrode provided on the main surface.

15. The high-frequency module according to claim 1,
wherein the metallic plate includes:
a main body portion bonded to a ground electrode provided on the main surface and vertically arranged on the main surface; and
a flat-plate-shaped main body end portion arranged at an end portion of the main body portion located in a direction parallel to the main surface and vertically arranged from the main surface toward the upper surface of the resin member, and
wherein the main body portion and the main body end portion are not parallel to each other.

16. A communication device comprising:
an RF signal processing circuit configured to process a high-frequency signal transmitted and received by an antenna; and
the high frequency module according to claim 1, configured to transmit the high-frequency signal between the antenna and the RF signal processing circuit.

* * * * *